(12) United States Patent
Kim et al.

(10) Patent No.: US 11,069,847 B2
(45) Date of Patent: Jul. 20, 2021

(54) THERMOELECTRIC MODULE

(71) Applicants: Hyundai Motor Company, Seoul (KR); Kia Motors Corporation, Seoul (KR)

(72) Inventors: Byung Wook Kim, Gyeonggi-do (KR); Kyong Hwa Song, Seoul (KR); Jin Woo Kwak, Gyeongsangbuk-do (KR); Gyung Bok Kim, Gyeonggi-do (KR); In Woong Lyo, Gyeonggi-do (KR); Han Saem Lee, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/556,609

(22) Filed: Aug. 30, 2019

(65) Prior Publication Data

US 2019/0386196 A1     Dec. 19, 2019

Related U.S. Application Data

(62) Division of application No. 15/340,944, filed on Nov. 1, 2016, now Pat. No. 10,439,122.

(30) Foreign Application Priority Data

Apr. 15, 2016  (KR) .................. 10-2016-0046397

(51) Int. Cl.
*H01L 35/32*    (2006.01)
*H01L 35/04*    (2006.01)

(52) U.S. Cl.
CPC .............. *H01L 35/32* (2013.01); *H01L 35/04* (2013.01)

(58) Field of Classification Search
None
See application file for complete search history.

(56) References Cited

U.S. PATENT DOCUMENTS

| | | | |
|---|---|---|---|
| 3,282,267 | A | 11/1966 | Eidus |
| 3,496,028 | A | 2/1970 | Norton et al. |
| 6,700,052 | B2 | 3/2004 | Bell |
| 7,999,172 | B2 | 8/2011 | Yu et al. |
| 8,933,317 | B2 | 1/2015 | Moczygemba et al. |

(Continued)

FOREIGN PATENT DOCUMENTS

JP       H11206032 A      7/1999

*Primary Examiner* — Edward J. Schmiedel
(74) *Attorney, Agent, or Firm* — Mintz Levin Cohn Ferris Glovsky and Popeo, P.C.; Peter F. Corless

(57) ABSTRACT

A thermoelectric module mounted on an uneven surface (a curved surface or an irregular surface) to reduce thermal boundary resistance and significantly improve thermoelectric power generation efficiency is provided. The thermoelectric module includes one or more first thermoelectric elements, one or more second thermoelectric elements having opposite polarity to that of the first thermoelectric elements and alternating with the first thermoelectric element. An electrode unit in provided and includes upper and lower electrodes configured to electrically connect the first and second thermoelectric elements. A connection member is configured to connect the first and second thermoelectric elements to vary the relative positions of the first and second thermoelectric elements.

1 Claim, 7 Drawing Sheets

(56) References Cited

U.S. PATENT DOCUMENTS

| | | |
|---|---|---|
| 10,003,001 B2 | 6/2018 | Kim et al. |
| 2003/0084935 A1* | 5/2003 | Bell ........................ H01L 35/32 136/200 |
| 2009/0014046 A1* | 1/2009 | Yu ........................... H01L 35/34 136/200 |
| 2012/0174956 A1 | 7/2012 | Smythe et al. |
| 2013/0213448 A1 | 8/2013 | Moczygemba et al. |
| 2017/0077377 A1* | 3/2017 | Kim ........................ H01L 35/32 |

* cited by examiner

THERMOELECTRIC MODULE

CROSS-REFERENCE TO RELATED APPLICATION

This application is a divisional application of U.S. Ser. No. 15/240,944, filed Nov. 1, 2016, which is based on and claims the benefit of priority to Korean Patent Application No. 10-2016-0046397, filed on Apr. 15, 2016, in the Korean Intellectual Property Office, the disclosure of which is incorporated herein in its entirety by reference.

BACKGROUND

Technical Field

The present disclosure relates to a thermoelectric module and more particularly, to a thermoelectric module coupled to and mounted on an uneven surface (e.g., a curved surface or an irregular surface) to reduce thermal boundary resistance and improve the efficiency of the thermoelectric power generation.

Description of Related Art

Typically, a thermoelectric module used in a thermoelectric power generation system utilizes the Seebeck effect that uses a difference in temperatures of both surfaces of the thermoelectric module to generate an electromotive force. During the thermoelectric power generation by the thermoelectric module, the output of the thermoelectric power generation may be increased by maintaining a substantial temperature difference between the high temperature side and the low temperature side. Accordingly, a heat transfer rate from a heat source to the thermoelectric module may significantly affect the output.

Furthermore, when a conventional thermoelectric module has a flat structure and a surface of a portion of a system on which the thermoelectric module is to be mounted is curved or otherwise uneven due to uneven patterns or the like, a heat spreader, a thermal paste, or the like, may be applied to the uneven surface to planarize the corresponding surface. Following planarization of the surface, the thermoelectric module may be coupled thereto. The heat spreader, the thermal paste, or the like, increases thermal resistance and the temperature decreases in the high temperature side of the thermoelectric module. Accordingly, a temperature difference in the thermoelectric module may be reduced and the output of the thermoelectric power generation may be significantly reduced. To overcome such disadvantages, an n-type element, a p-type element, an insulating board, electrodes, and the like may be configured to have a structure that corresponds to the uneven surface. However, such a configuration may add complexity to the manufacturing process and increase manufacturing costs.

The above information disclosed in this section is intended merely to aid in the understanding of the background of the invention and therefore it may contain information that does not form the prior art that is already known in this country to a person of ordinary skill in the art.

SUMMARY

An aspect of the present disclosure provides a thermoelectric module that is coupled to and mounted on an uneven surface while corresponding to the uneven surface. Namely, the thermal boundary resistance may be reduced and a temperature difference between the high temperature side and the low temperature side may be increased. Accordingly, the output of thermoelectric power generation may be increased.

According to an aspect of the present disclosure a thermoelectric module may include one or more first thermoelectric elements, one or more second thermoelectric elements having an opposite polarity to that of the first thermoelectric elements and alternating with the first thermoelectric elements, upper electrodes that electrically connect an upper portion of the first thermoelectric element to an upper portion of the second thermoelectric element, lower electrodes that electrically connect a lower portion of the first thermoelectric element to a lower portion of the second thermoelectric element and a pivot unit disposed between the upper electrodes and/or between the lower electrodes. The pivot units may be configured to vary the relative positions of adjacent first and second thermoelectric elements. The upper electrodes may include a first upper electrode plate coupled to an upper surface of the first thermoelectric element and a second upper electrode plate coupled to an upper surface of the second thermoelectric element. The lower electrodes may include a first lower electrode plate coupled to a lower surface of the first thermoelectric element and a second lower electrode plate coupled to a lower surface of the second thermoelectric element.

The pivot unit may include an upper pivot unit disposed between the upper electrodes and may be configured to vary the relative positions of the upper portions of the first and second thermoelectric elements. A lower pivot unit may be disposed between the lower electrodes and may be configured to vary the relative positions of the lower portions of the first and second thermoelectric elements. The upper pivot unit may be configured to pivotally connect adjacent first and second upper electrode plates. The lower pivot unit may be configured to pivotally connect adjacent first and second lower electrode plates. The upper pivot unit may include a pair of pivot lugs that protrude from the first and second upper electrode plates positioned adjacent to each other and a pivot bearing provided to pass through the pair of pivot lugs.

The lower pivot unit may include a pair of pivot lugs that protrude from the first and second lower electrode plates disposed adjacent to each other and a pivot bearing provided to pass through the pair of pivot lugs. The upper and lower pivot units may be disposed in a zigzag pattern in a lateral (e.g., lengthwise) direction of the first and second thermoelectric elements to electrically connect in series the first thermoelectric elements to the second thermoelectric elements. The pivot bearing may be configured to pivot on an axis thereof that is parallel to at least one axis direction of a Cartesian coordinate system. The upper pivot unit and the lower pivot unit may be provided as a ball-socket joint component.

The upper electrodes may include a first upper electrode plate individually coupled to an upper surface of the first thermoelectric element, a second upper electrode plate individually coupled to an upper surface of the second thermoelectric element and a third upper electrode plate coupled to an upper surfaces of at least one pair of adjacent first and second thermoelectric elements. The lower electrodes may include a first lower electrode plate individually coupled to a lower surface of the first thermoelectric element, a second lower electrode plate individually coupled to a lower surface of the second thermoelectric element and a third lower electrode plate coupled to lower surfaces of at least one pair of adjacent first and second thermoelectric elements.

BRIEF DESCRIPTION OF THE DRAWINGS

The above and other objects, features and advantages of the present disclosure will be more apparent from the following detailed description when taken in conjunction with the accompanying drawings.

DETAILED DESCRIPTION

Figure 1:
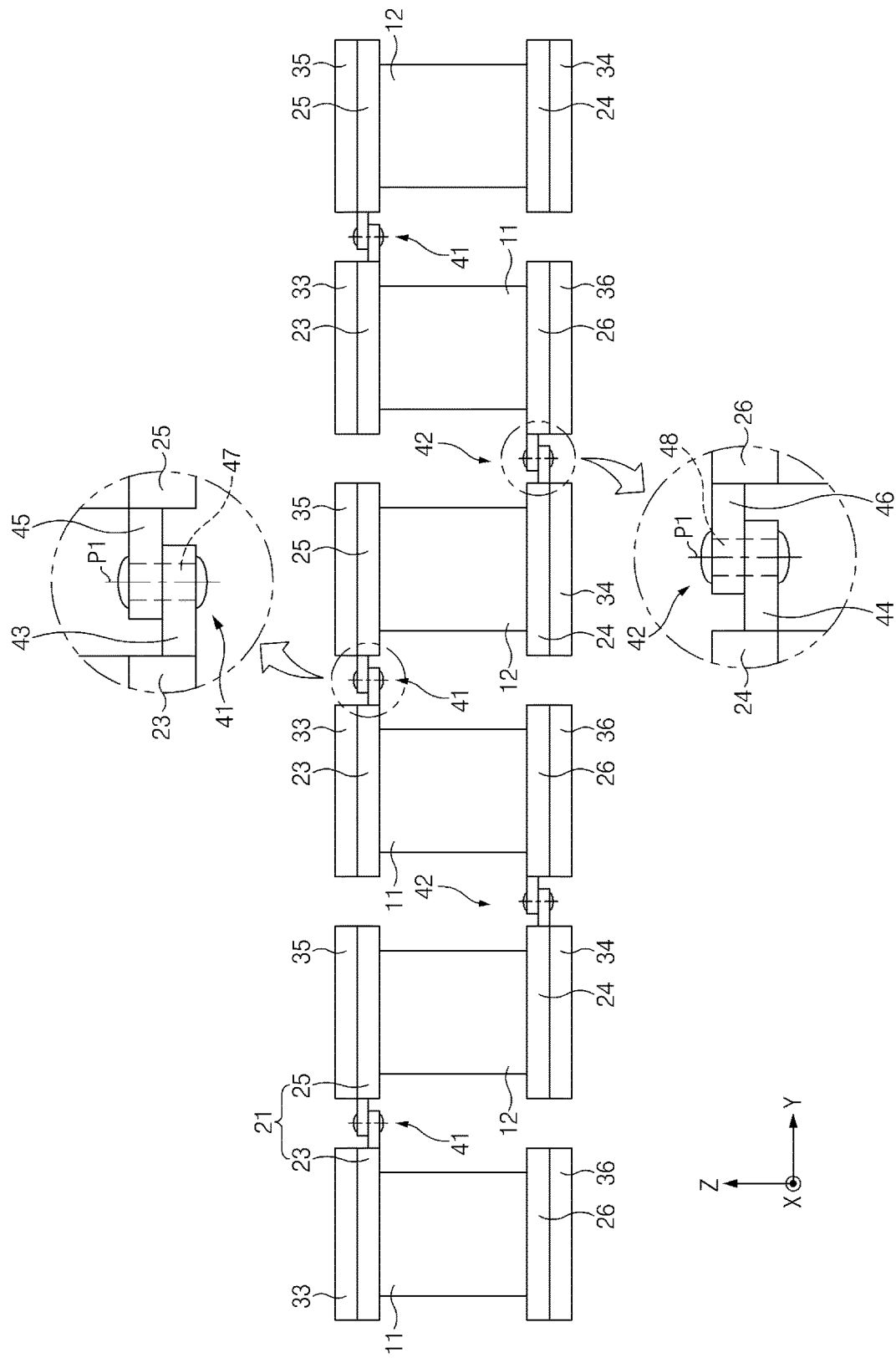
FIG. 1 illustrates an exemplary front cross-sectional view of a thermoelectric module, according to an exemplary embodiment of the present disclosure.

Hereinafter, exemplary embodiments of the present disclosure will be described in detail with reference to the accompanying drawings. For reference, the dimensions of elements, thicknesses of lines, and the like, illustrated in the drawings referred to in the description of exemplary embodiments of the present disclosure, may be exaggerated for convenience of understanding. In addition, terms used for describing the present inventive concept have been defined in consideration of the functions of elements, and may be altered in accordance with the intention of a user or an operator, in view of practice, or the like. Therefore, the terms should be defined on the basis of the entirety of this specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

FIG. 1 illustrates a thermoelectric module, according to an exemplary embodiment of the present disclosure. As illustrated in FIG. 1, the thermoelectric module, according to the exemplary embodiment of the present disclosure may include a one or more first thermoelectric elements 11, one or more second thermoelectric elements 12 disposed to be spaced apart from the first thermoelectric elements 11, and an electrode unit having upper and lower electrodes 21 and 22 that electrically connect the first thermoelectric elements 11 to the second thermoelectric elements 12. The first thermoelectric element 11 and the second thermoelectric element 12 may have different polarities. In particular, the plurality of first thermoelectric elements 11 and the plurality of second thermoelectric elements 12 may be disposed alternately. The first thermoelectric element 11 may be an n-type semiconductor element and the second thermoelectric element 12 may be p-type semiconductor element, or vice versa according to circumstances.

The electrode unit may be configured to electrically connect in series the first thermoelectric elements 11 to the second thermoelectric elements 12. The electrode unit may include the upper electrodes 21 configured to electrically connect an upper portion of the first thermoelectric element 11 to an upper portion of the second thermoelectric element 12 and the lower electrodes 22 configured to electrically connect a lower portion of the first thermoelectric element 11 to a lower portion of the second thermoelectric element 12. The upper electrodes 21 may include a first upper electrode plate 23 coupled to an upper surface of the first thermoelectric element 11, and a second upper electrode plate 25 coupled to an upper surface of the second thermoelectric element 12.

A first upper insulating board 33 may have an area greater than or equal to that of an upper surface of the first upper electrode plate 23 and may be coupled to the upper surface of the first upper electrode plate 23. A second upper insulating board 35 may have an area greater than or equal to that of an upper surface of the second upper electrode plate 25 and may be coupled to the upper surface of the second upper electrode plate 25. The first upper insulating board 33 and the second upper insulating board 35 may prevent a short circuit of the first upper electrode plate 23 and the second upper electrode plate 25. The lower electrodes 22 may include a first lower electrode plate 24 coupled to a lower surface of the first thermoelectric element 11, and a second lower electrode plate 26 coupled to a lower surface of the second thermoelectric element 12.

A first lower insulating board 34 may have an area greater than or equal to that of a lower surface of the first lower electrode plate 24 and may be coupled to the lower surface of the first lower electrode plate 24. A second lower insulating board 36 may have an area greater than or equal to that of a lower surface of the second lower electrode plate 26 and may be coupled to the lower surface of the second lower electrode plate 26. The first lower insulating board 34 and the second lower insulating board 36 may prevent a short circuit of the first lower electrode plate 24 and the second lower electrode plate 26.

Accordingly, the first upper electrode plate 23 and the first lower electrode plate 24 may be disposed on the upper surface and the lower surface of the first thermoelectric element 11, respectively. Further, the second upper electrode plate 25 and the second lower electrode plate 26 may be disposed on the upper surface and the lower surface of the second thermoelectric element 12, respectively. For example, the first and second thermoelectric elements 11 and 12 may be individually disposed with the upper electrode plates 23 and 25 and the lower electrode plates 24 and 26.

The upper electrodes 21 and the lower electrodes 22 may be connected with a connection member. For example, in some exemplary embodiments the connection member may be an upper pivot unit 41 and a lower pivot unit 42. Accordingly, the relative positions of the first and second thermoelectric elements 11 and 12 may be varied. In particular, the upper pivot unit 41 and the lower pivot unit 42 may be formed of a conductive material and may provide electrical paths with respect to the electrode plates 23, 25, 24, and 26 of the first and second thermoelectric elements 11 and 12. The upper pivot unit 41 may be disposed between the upper electrode plates 23 and 25 of the upper electrodes 21 and may vary the relative positions of the upper portion of the first thermoelectric element 11 and the upper portion of the second thermoelectric element 12. According to exemplary embodiments of the present disclosure, the upper pivot unit 41 may be configured to pivotally connect adjacent first and second upper electrode plates 23 and 25.

As illustrated in exemplary enlarged views of FIG. 1, the upper pivot unit 41 may include a pair of pivot lugs 43 and 45 that protrude from the first upper electrode plate 23 and the second upper electrode plate 25, respectively, may be disposed adjacent to each other, and a pivot bearing 47 may be configured to pass through the pair of pivot lugs 43 and 45. Each of the pivot lugs 43 and 45 may have an aperture through which the pivot bearing 47 may pass. For example, the two pivot lugs 43 and 45 may overlap each other while allowing respective apertures thereof to correspond to each other. The pivot bearing 47 may extend on an axis P1 and may be inserted into the apertures of the two pivot lugs 43 and 45. The pivot bearing 47 may be formed of a conductive material and may be configured to electrically connect the first upper electrode plate 23 to the second upper electrode plate 25.

The lower pivot unit 42 may be disposed between the lower electrode plates 24 and 26 of the lower electrodes 22, and may vary relative positions of the lower portion of the first thermoelectric element 11 and the lower portion of the second thermoelectric element 12. According to exemplary embodiments of the present disclosure, the lower pivot unit 42 may pivotally connect adjacent first and second lower electrode plates 24 and 26. As illustrated in the enlarged exemplary views of FIG. 1, the lower pivot unit 42 may include a pair of pivot lugs 44 and 46 that protrude from the first lower electrode plate 24 and the second lower electrode plate 26, respectively, dispose adjacent to each other, and a pivot bearing 48 that may pass through the pair of pivot lugs 44 and 46. Each of the pivot lugs 44 and 46 may have a through aperture configured to allow the pivot bearing 48 to pass therethrough. In particular, two pivot lugs 44 and 46 may overlap each other and may be configured to position respective apertures thereof to correspond to each other. The pivot bearing 48 may extend the axis P1 and may be inserted into the apertures of the two pivot lugs 44 and 46.

The pivot bearing 48 may be formed of a conductive material to electrically connect the first lower electrode plate 24 to the second lower electrode plate 26.

In particular, to electrically connect in series the plurality of first thermoelectric elements 11 to the plurality of second thermoelectric elements 12, the upper and lower pivot units 41 and 42 may be disposed in a zigzag pattern in a lateral direction of the thermoelectric elements 11 and 12. The axis P1 of the pivot bearings 47 and 48, according to the first exemplary embodiment, may be disposed parallel to a Z-axis direction of the Cartesian coordinate system of FIG. 1. Accordingly, the first upper electrode plate 23 and the second upper electrode plate 25 may be configured to pivot on the axis P1 of the pivot bearing 47. The first lower electrode plate 24 and the second lower electrode plate 26 may be configured to pivot on the axis P1 of the pivot bearing 48.

The first lower insulating board 34 and the second lower insulating board 36 may be coupled to a heat source, for example, an exhaust manifold or an exhaust pipe of a vehicle, to generate a high temperature side. The first upper insulating board 33 and the second upper insulating board 35 may include a cooling unit (not shown) through which a cooling fluid passes, to generate a low temperature side.

Figure 2:
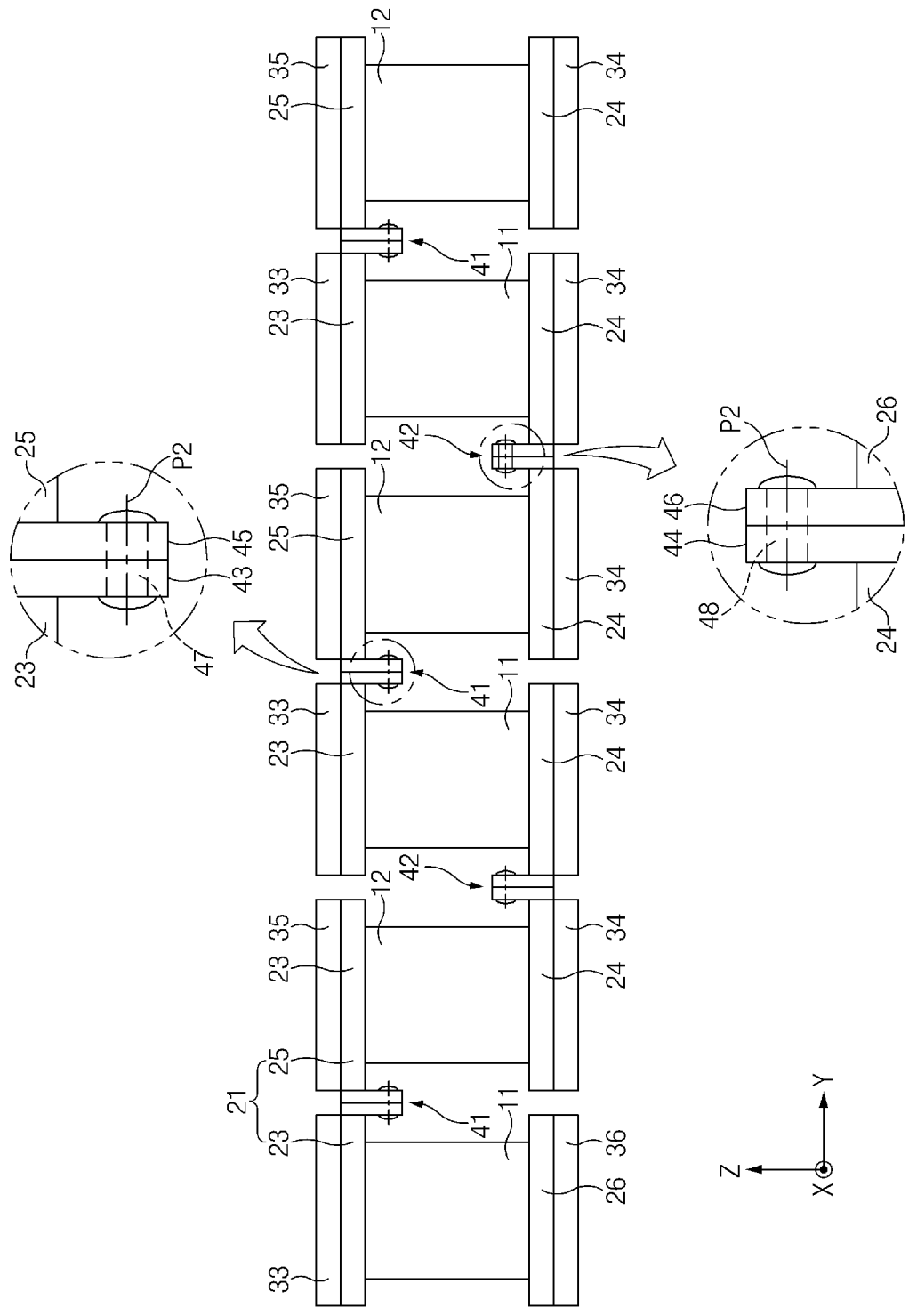
FIG. 2 illustrates an exemplary front cross-sectional view of a thermoelectric module, according to an exemplary embodiment of the present disclosure.

FIG. 2 illustrates a thermoelectric module, according to an exemplary embodiment of the present disclosure. An axis P2 of the pivot bearings 47 and 48, according to the exemplary embodiment, may be parallel to a Y-axis direction of the Cartesian coordinate system of FIG. 2. Accordingly, the first upper electrode plate 23 and the second upper electrode plate 25 may be configured to pivot on the axis P2 of the pivot bearing 47. Further, the first lower electrode plate 24 and the second lower electrode plate 26 may be configured to pivot on the axis P2 of the pivot bearing 48.

Figure 3:
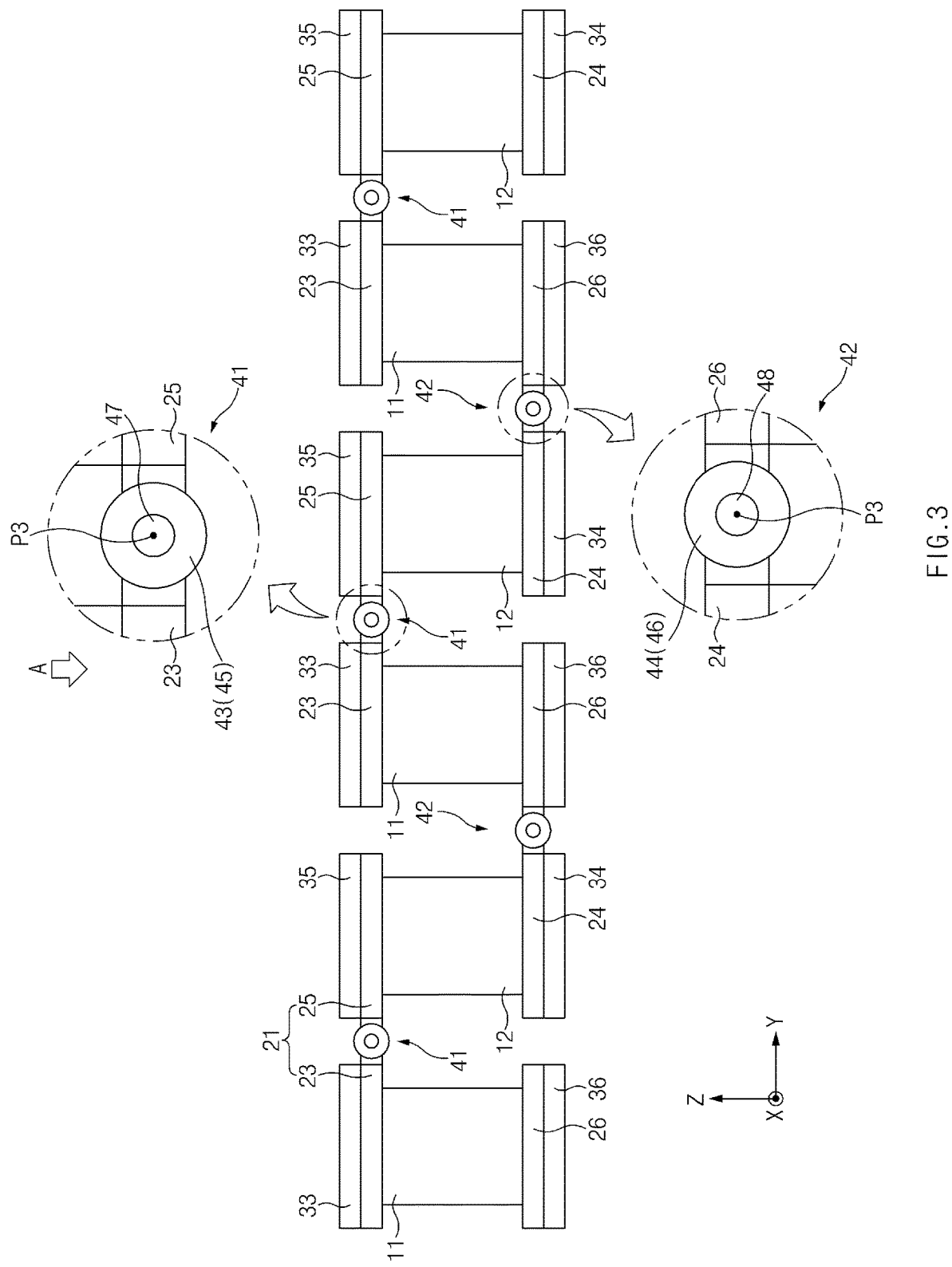
FIG. 3 illustrates an exemplary front cross-sectional view of a thermoelectric module, according to an exemplary embodiment of the present disclosure.
Figure 4:
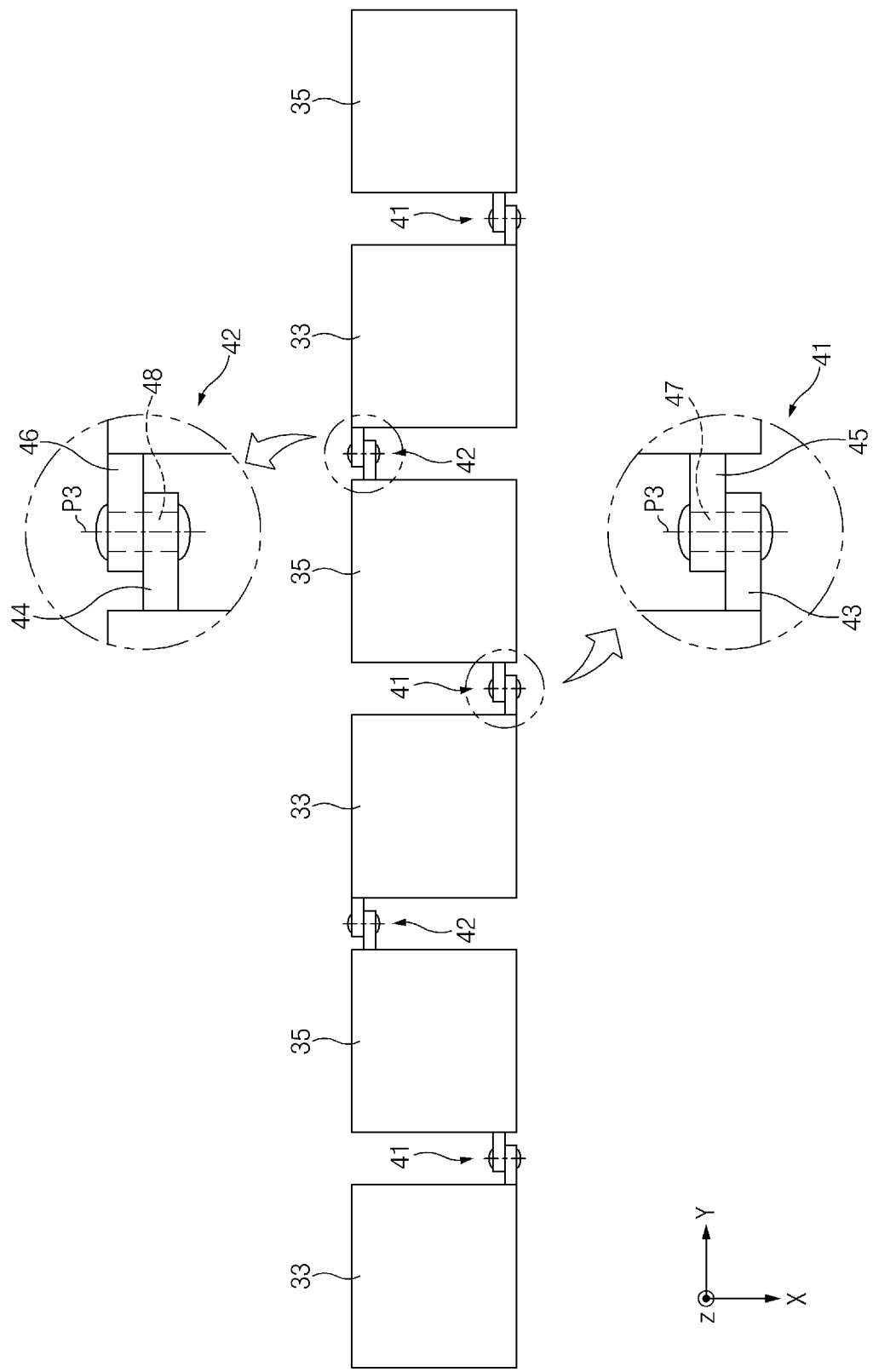
FIG. 4 illustrates an exemplary plan view in a direction of arrow A of FIG. 3 according to an exemplary embodiment of the present disclosure.

FIGS. 3 and 4 illustrate a thermoelectric module, according to an exemplary embodiment of the present disclosure. An axis P3 of the pivot bearings 47 and 48, according to the exemplary embodiment, may be disposed parallel to an X-axis direction of the Cartesian coordinate system of FIGS. 3 and 4. Accordingly, the first upper electrode plate 23 and the second upper electrode plate 25 may be configured to pivot on the axis P3 of the pivot bearing 47. The first lower electrode plate 24 and the second lower electrode plate 26 may be configured to pivot on the axis P3 of the pivot bearing 48. In particular, the axes P1, P2, and P3 of the pivot bearings 47 and 48 may extend to be parallel to the X-axis, Y-axis, and Z-axis directions of the Cartesian coordinate system, but are not limited thereto. The axes P1, P2, and P3 of the pivot bearings 47 and 48 may be variously modified.

Figure 5:
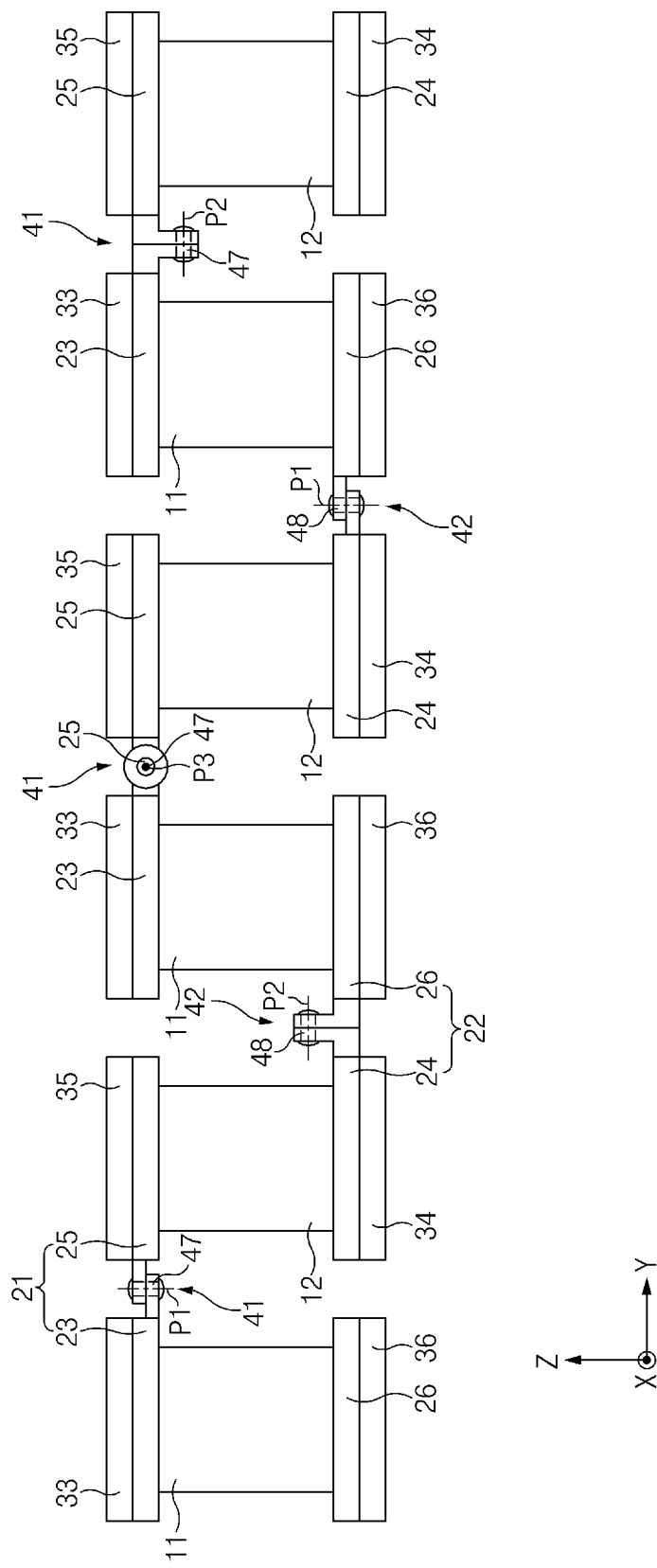
FIG. 5 illustrates an exemplary front cross-sectional view of a thermoelectric module, according to an exemplary embodiment of the present disclosure.

FIG. 5 illustrates a thermoelectric module, according to an exemplary embodiment of the present disclosure. The pivot bearings 47 and 48, according to the exemplary embodiment, may have different axes P1, P2, and P3. Any one axis P1 of the pivot bearings 47 and 48 may be parallel to the Z-axis direction of the Cartesian coordinate system of FIG. 5, a second axis P2 of the pivot bearings 47 and 48 may be parallel to the Y-axis direction of the Cartesian coordinate system of FIG. 5, and a third axis P3 of the pivot bearings 47 and 48 may be parallel to the X-axis direction of the Cartesian coordinate system of FIG. 5. In this manner, the pivot bearings 47 and 48 may have different axes P1, P2, and P3 that vary the relative positions of the first and second thermoelectric elements 11 and 12.

Figure 6:
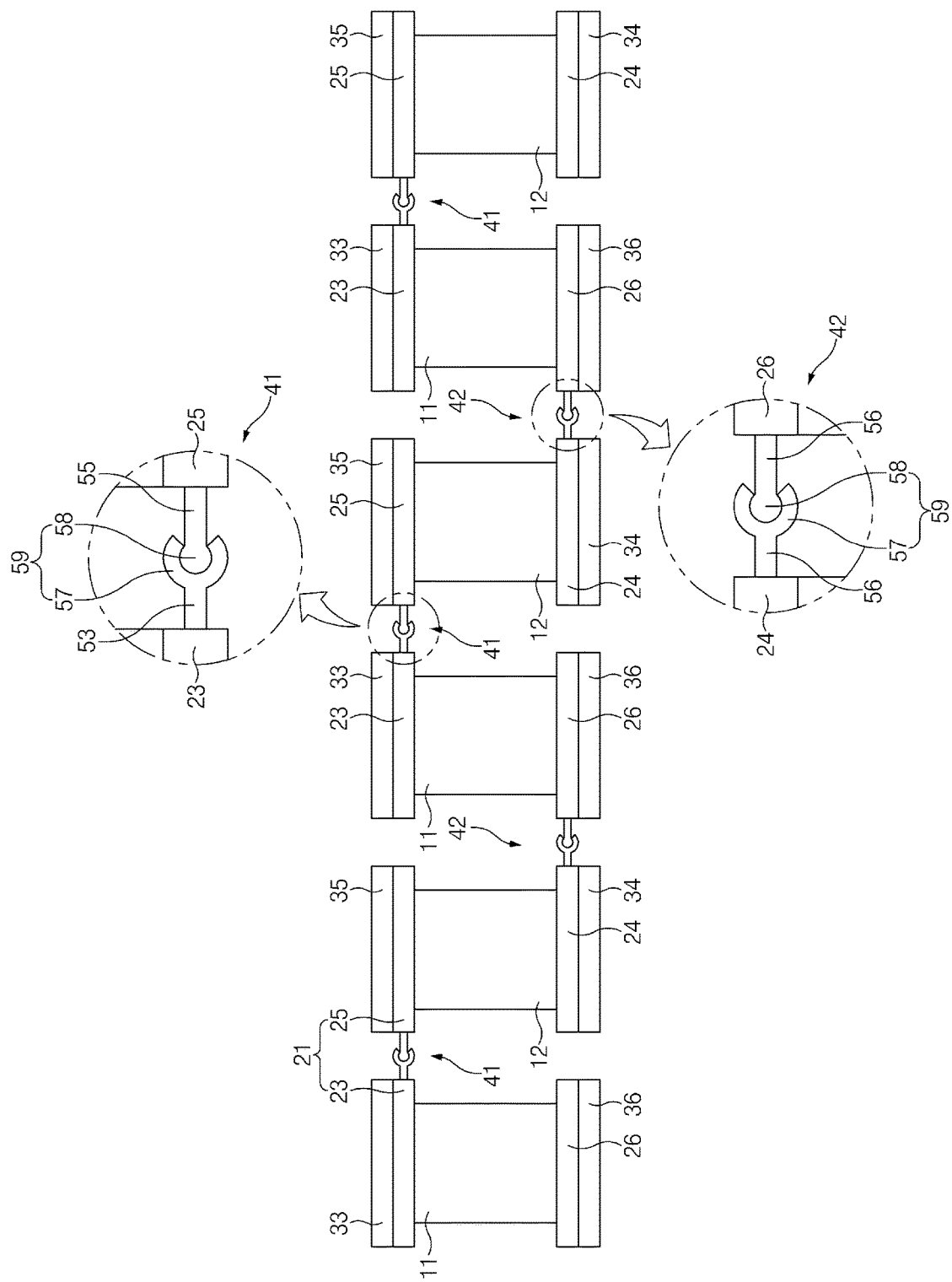
FIG. 6 illustrates an exemplary front cross-sectional view of a thermoelectric module, according to an exemplary embodiment of the present disclosure.

FIG. 6 illustrates a thermoelectric module, according to an exemplary embodiment of the present disclosure. According to the exemplary embodiment, the upper pivot unit 41 may include an extension component 53 that extends from the first upper electrode plate 23, an extension component 55 that extends from the second upper electrode plate 25, and a ball-socket joint component 59 disposed between adjacent ends of the two extension components 53 and 55. The ball-socket joint component 59 may include a socket component 57 integrated with a first extension component 53, and a joint ball 58 integrated with a second extension component 55.

The lower pivot unit 42 may include an extension component 54 that extends from the first lower electrode plate 24, an extension component 56 that extends from the second lower electrode plate 26, and a ball-socket joint component 59 disposed between adjacent ends of the two extension components 54 and 56. The ball-socket joint component 59 may include a socket component 57 integrated with a first extension component 54, and a joint ball 58 integrated with a second extension component 56. In this manner, the first thermoelectric element 11 and the second thermoelectric element 12 may be configured to freely pivot by the ball-socket joint component 59 included in the upper pivot unit 41 and the lower pivot unit 42. Accordingly, the thermoelectric module may be mounted on uneven surfaces of various shapes.

Figure 7:
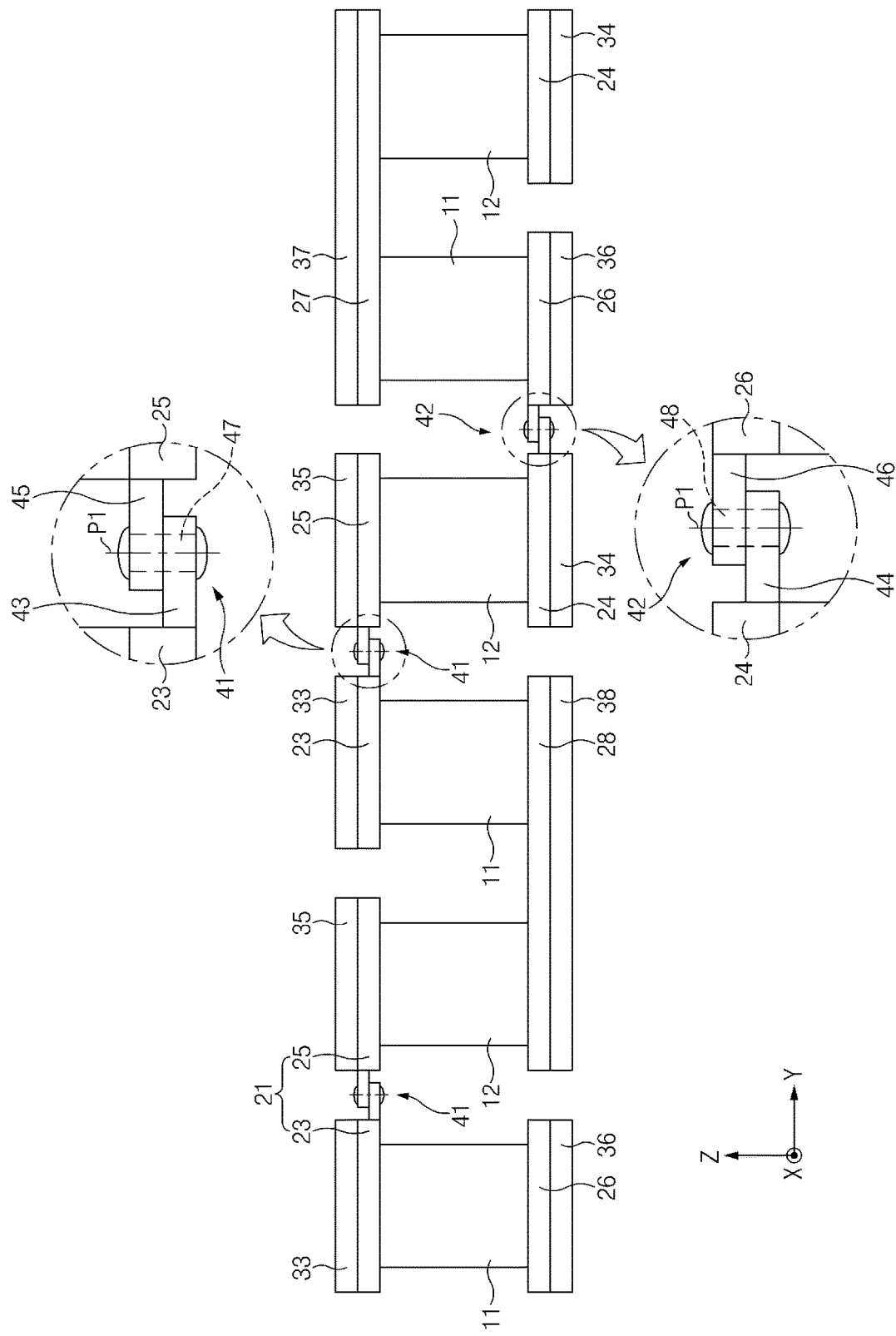
FIG. 7 illustrates an exemplary side view of a thermoelectric module, according to an exemplary embodiment of the present disclosure.

FIG. 7 illustrates a thermoelectric module, according to an exemplary embodiment of the present disclosure. According to the exemplary embodiment of the present disclosure, a plurality of upper electrodes may include the first upper electrode plates 23 coupled to individual upper surfaces of a portion of the plurality of first thermoelectric elements 11, the second upper electrode plates 25 coupled to individual upper surfaces of a portion of the plurality of second thermoelectric elements 12, and a third upper electrode plate 27 coupled to all upper surfaces of at least one pair of adjacent first and second thermoelectric elements 11 and 12. The third upper electrode plate 27 may be of a greater geometric size than the first upper electrode plate 23 and the second upper electrode plate 25 and may be coupled to the upper surfaces of at least one pair of adjacent first and second thermoelectric elements 11 and 12.

A plurality of lower electrodes may include the first lower electrode plates 24 coupled to individual lower surfaces of a portion of the plurality of first thermoelectric elements 11, the second lower electrode plates 26 coupled to individual lower surfaces of a portion of the plurality of second thermoelectric elements 12, and a third lower electrode plate 28 coupled to the lower surfaces of at least one pair of adjacent first and second thermoelectric elements 11 and 12. The third lower electrode plate 28 may be a greater geometric size than the first lower electrode plate 24 and the second lower electrode plate 26 and may be coupled to all lower surfaces of at least one pair of adjacent first and second thermoelectric elements 11 and 12. In addition, an integrated upper insulating board 37 having an area greater than or equal to of the area of an upper surface of the third upper electrode plate 27 may be coupled to the upper surface of the third upper electrode plate 27. Further, an integrated lower insulating board 38 having an area greater than or equal to the area of a lower surface of the third lower electrode plate 28 may be coupled to the lower surface of the third upper electrode plate 28.

As illustrated in FIG. 7, the upper pivot unit 41 may be disposed between adjacent first and second upper electrode plates 23 and 25. According to other exemplary embodiments, the upper pivot unit 41 may be selectively disposed between adjacent first and third upper electrode plates 23 and 27 or between adjacent second and third upper electrode plates 25 and 27, which is not illustrated in FIG. 7. As illustrated in FIG. 7, the lower pivot unit 42 may be disposed between adjacent first and second lower electrode plates 24 and 26. According to other exemplary embodiments, the lower pivot unit 42 may be selectively disposed between adjacent first and third lower electrode plates 24 and 28 or between adjacent second and third lower electrode plates 26 and 28, which is not illustrated in FIG. 7.

As stated above, the first and second thermoelectric elements 11 and 12 may be configured to be electrically connected in series by the pivot units 41 and 42 and may be connected individually or per pair to form various configurations. Thus, the degree of freedom in shapes of the thermoelectric module may be increased to thereby effectively compensate for the structures, shapes, and the like of the heat source and the cooling unit. As set forth above, adjacent thermoelectric elements may be connected to allow for variations in relative positions thereof to correspond to an uneven surface for example, a thermoelectric module can be closely adhered to and mounted on an uneven surface. Thus, thermal boundary resistance may be reduced and a temperature difference between the high temperature side and the low temperature side may be increased. Accordingly, the output of thermoelectric power generation may be increased.

Hereinabove, although the present disclosure has been described with reference to exemplary embodiments and the accompanying drawings, the present disclosure is not limited to the disclosed embodiments. On the contrary, it is intended to cover, various modifications and equivalents arrangements altered by those skilled in the art to which the present disclosure pertains without departing from the spirit and scope of the present disclosure claimed in the following claims.

What is claimed is:

1. A thermoelectric module, comprising:
   a plurality of first thermoelectric elements;
   a plurality of second thermoelectric elements, each of the plurality of second thermoelectric elements alternating with each of the plurality of first thermoelectric elements to form at least three pairs of alternating first and second thermoelectric elements;
   a plurality of upper electrodes including at least two first upper electrode plates each individually coupled to an upper surface of a first thermoelectric element of a first pair of alternating first and second thermoelectric elements and a first thermoelectric element of a second pair of alternating first and second thermoelectric elements; at least two second upper electrode plates each individually coupled to an upper surface of a second thermoelectric element of the first pair and a second thermoelectric element of the second pair; and a third upper electrode plate coupled to upper surfaces of a first thermoelectric element and a second thermoelectric element of a third pair of alternating first and second thermoelectric elements;
   a plurality of lower electrodes including at least two first lower electrode plates each individually coupled to a lower surface of the first thermoelectric element of the first pair and the third pair; at least two second lower electrode plates each individually coupled to a lower surface of the second thermoelectric element of the second pair and the third pair; and a third lower electrode plate coupled to lower surfaces of the second thermoelectric element of the first pair and the first thermoelectric element of the second pair; and
   a pivot unit including an upper pivot unit pivotally connecting one of the at least two first upper electrode plates to an adjacent one of the at least two second upper electrode plates, and a lower pivot unit pivotally connecting one of the at least two first lower electrode plates to an adjacent one of the at least two second lower electrode plates, wherein the upper pivot unit and the lower pivot unit are disposed at upper portions of the plurality of first thermoelectric elements and the plurality of second thermoelectric elements and at lower portions of the plurality of first thermoelectric elements and the plurality of second thermoelectric elements, respectively, along a longitudinal direction of the thermoelectric module.

\* \* \* \* \*